(12) United States Patent
Tsou

(10) Patent No.: US 7,772,019 B2
(45) Date of Patent: Aug. 10, 2010

(54) METHOD FOR PACKAGING LED DEVICE

(75) Inventor: Wen-Chieh Tsou, Jieshou Village (TW)

(73) Assignee: Everlight Electronics Co., Ltd., Tu Chen, Taipei Hsien (TW)

( * ) Notice: Subject to any disclaimer, the term of this patent is extended or adjusted under 35 U.S.C. 154(b) by 49 days.

(21) Appl. No.: 12/334,035

(22) Filed: Dec. 12, 2008

(65) Prior Publication Data

US 2009/0155937 A1  Jun. 18, 2009

(30) Foreign Application Priority Data

Dec. 12, 2007  (TW) .............................. 96147533 A

(51) Int. Cl.
*H01L 21/00* (2006.01)

(52) U.S. Cl. .............................. 438/26; 438/27; 438/64; 438/65; 257/E33.056; 257/E33.059

(58) Field of Classification Search ................... 438/22, 438/25, 26, 27, 33, 57, 64, 65, 68; 257/E33.056, 257/E33.059

See application file for complete search history.

(56) References Cited

U.S. PATENT DOCUMENTS

| 6,531,328 B1* | 3/2003 | Chen ............................ 438/26 |
| 2006/0261357 A1* | 11/2006 | Tsou et al. ..................... 257/88 |
| 2009/0290273 A1* | 11/2009 | Shih et al. ...................... 361/56 |

\* cited by examiner

*Primary Examiner*—Ha Tran T Nguyen
*Assistant Examiner*—Daniel Whalen
(74) *Attorney, Agent, or Firm*—Muncy, Geissler, Olds & Lowe, PLLC

(57) ABSTRACT

A method for packaging LED device comprises following steps: (1) A substrate with a cavity is provided; (2) A electrode layer is formed and located on the cavity and the surface of the substrate; (3) A opening through the cavity is formed, whereby a anode and a cathode are separated by the opening; (4) A LED chip is disposed on the bottom of the cavity and the opening, where the led chip is electrically connected to the anode and the cathode; (5) The cavity with the opening is filled with packaging material; (6) The packaging material is hardened, thereby the hardened packaging material with a recess that corresponding to the top of the chip; and (7) The LED device is formed by performing a cutting process along a cutting line in the cavity.

8 Claims, 12 Drawing Sheets

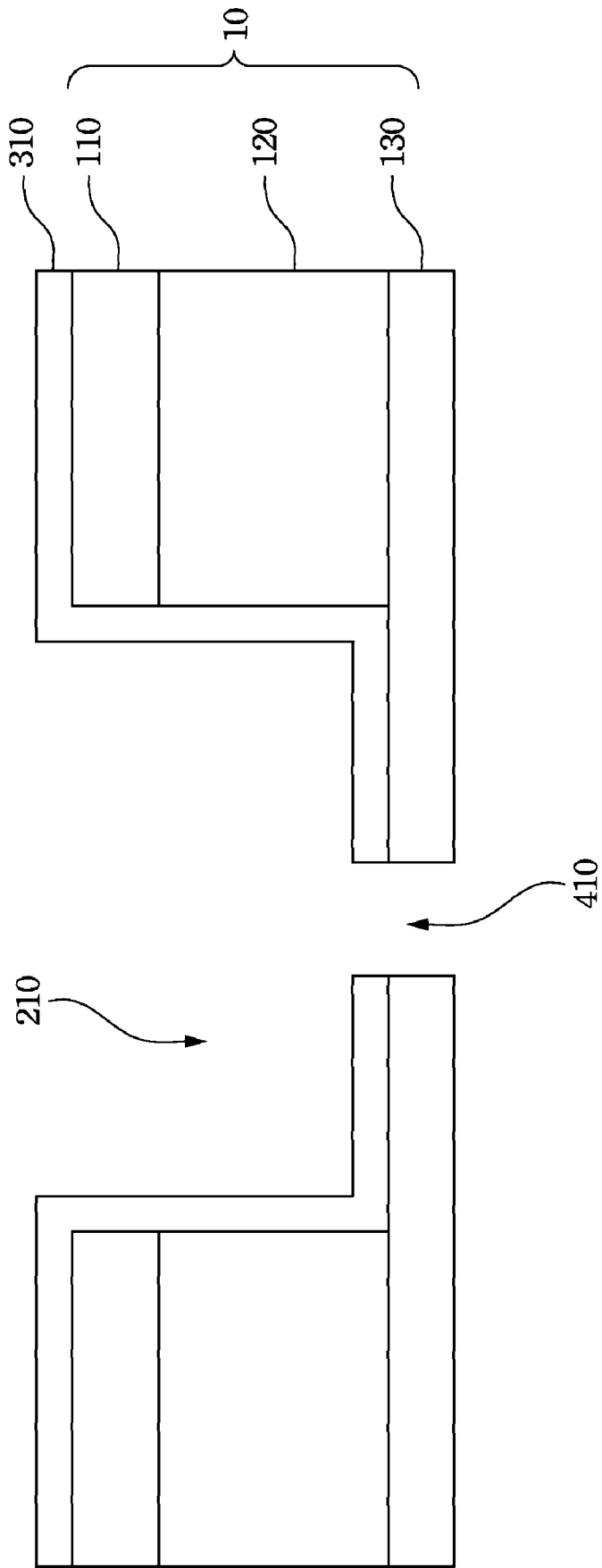

METHOD FOR PACKAGING LED DEVICE

BACKGROUND

1. Field of Invention

The present invention relates to a method for packaging an LED device. More particularly, the present invention relates to a method for packaging a thin type LED device.

2. Description of Related Art

Generally, light-emitting diode (LED) is used as the indicating lamp or used in the display board. Through the fast technical development, the LED can be used for the general lighting. The light-emitting diode (LED) can directly convert the electricity into the light radiation with high efficiency and its life duration lasts for that from ten thousands hours to hundred thousand hours. The LED also has many merits including compact size, no mercury contained, low temperature application, light emission with directionality and board spectrum.

Current popular applications of the LED include a back-light source for keypads of mobile devices and indication lights for a variety of electrical devices. More and more attentions are focused on the applications of the liquid crystal display backlights, and the applications of the LED get broader in the future. After the technologies are continuously improved, slim and compact designs are critical requirements for most of electronic devices; therefore it will be the point to reduce the thickness of the LED devices.

However, due to the limitations in conventional molding tools, the thickness of the packaging material encapsulating LED dies in conventional LED devices is quite thick.

For the foregoing reasons, a new method in packaging LED device for reducing the thickness of the packaging material encapsulating the LED die is quite needed.

SUMMARY

In one aspect, the present invention is directed to a method for packaging LED device.

According to one embodiment of the present invention, the method for packaging LED device comprise following steps:

(1) A substrate is provided, wherein the substrate has a cavity;

(2) An electrode layer is formed on the cavity and the surface of the substrate;

(3) An opening is formed through the bottom of the cavity, wherein the opening separates the electrode layer into an anode and a cathode;

(4) A LED die is disposed on the bottom of the cavity and is electrically connected to the anode and the cathode;

(5) Packaging material is filled into the cavity and the opening;

(6) The packaging material is hardened, wherein a recess is formed in the hardened packaging material correspondingly above the LED die; and (7) A cutting process is performed along a cutting line in the cavity to form the LED device.

Compared with the conventional art, one of the advantageous features of the present invention comparing is the improvement in the reliability of the method for packaging LED device. Accordingly, It should be appreciated that one aspect of the present invention can be achieved technical advancement and practicality, and has a lot of useful value; the one aspect of the present invention has the following advantages:

(1) The packaging material is reduced so as to save the cost; and (2) The LED device corresponding to the need of the market is made.

It is to be understood that both the foregoing general description and the following detailed description are by examples, and are intended to provide further explanation of the invention as claimed.

BRIEF DESCRIPTION OF THE DRAWINGS

The present description will be better understood from the following detailed description read in light of the accompanying drawings, wherein:

FIG. 1, FIG. 2, FIG. 3 and FIG. 4A illustrate intermediate stages in forming a substrate in accordance with an embodiment of the present invention;

DETAILED DESCRIPTION

Figure 1:
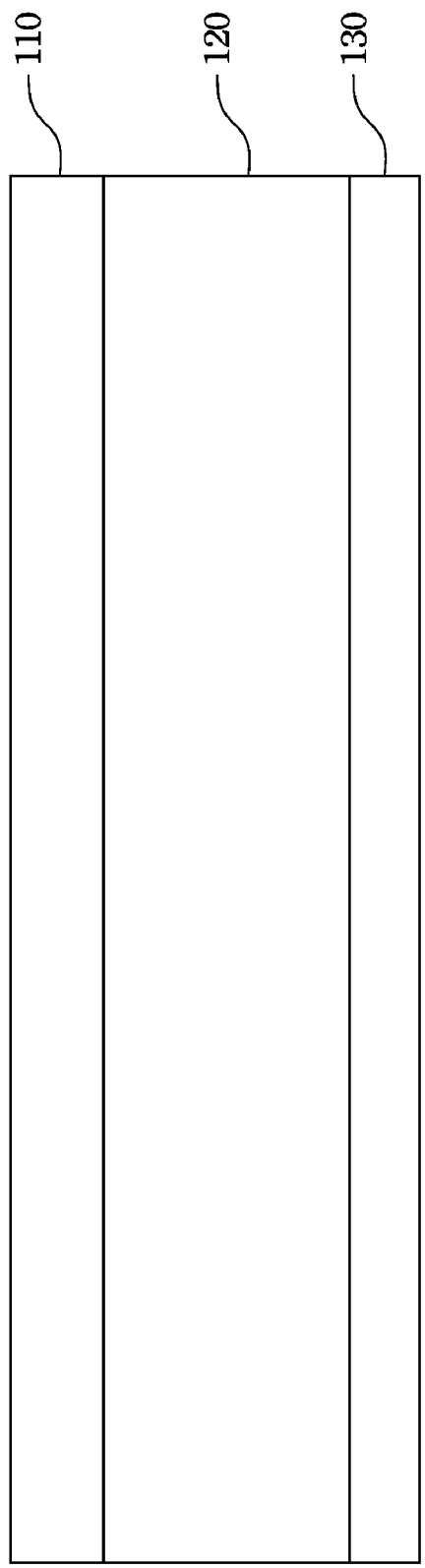

FIG. 1, FIG. 2, FIG. 3 and FIG. 4A illustrate intermediate stages in forming a substrate in accordance with an embodiment of the present invention. Please refer to FIG. 1. In FIG. 1, the substrate 10 is provided. The substrate 10 may comprise a first metal layer 130, the second metal layer 110 and the gel layer 120. The gel layer 120 is formed on the first metal layer 130. The second metal layer 110 is formed on the gel layer 120. In one embodiment, the second metal layer 110 may comprise copper, and the first metal layer 130 may comprise copper, nickel and gold. In a manner of forming the first metal layer 130, at first a first copper layer (not shown) is formed; then, a second copper layer (not shown) is formed on the first copper layer; then, a nickel layer (not shown) is formed on the second copper layer; last, a gold layer (not shown) is formed on the nickel layer. In another embodiment, the first metal layer 130 may comprise copper and silver. In another manner of forming the first metal layer 130, the copper layer and the silver layer may be formed by means of electroplating. The gel layer 120 may comprise BT Resin, alternatively, the gel layer 120 may comprise other material, such as epoxy, polyester, acrylic ester, fluoro-polymer, polyphenylene oxide, polyimide, phenolicresin, polysulfone, silicone polymer, cyanate Ester, polyethylene combinations thereof, or the like.

Figure 2:
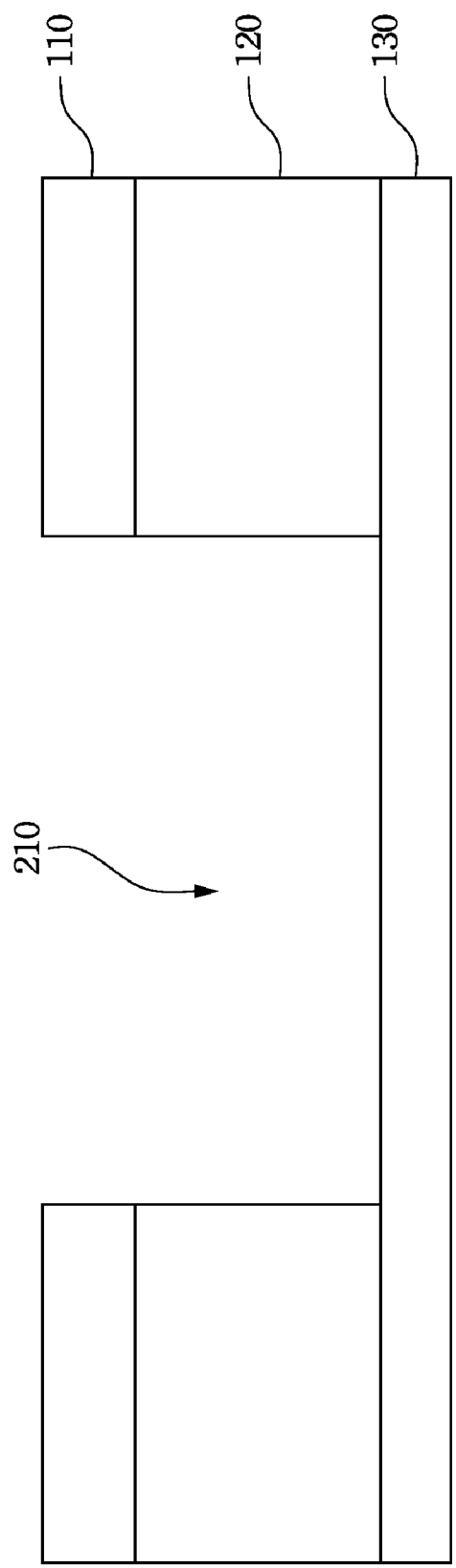

Please refer to FIG. 2. In FIG. 2, a cavity 210 is formed in the substrate 10. In one embodiment, at first the second metal layer 110 is removed by means of etching or laser; then, the gel layer 120 is removed by means of etching or laser and the surface of the first metal layer 130 is appeared, so that the cavity 210 is formed.

Figure 3:
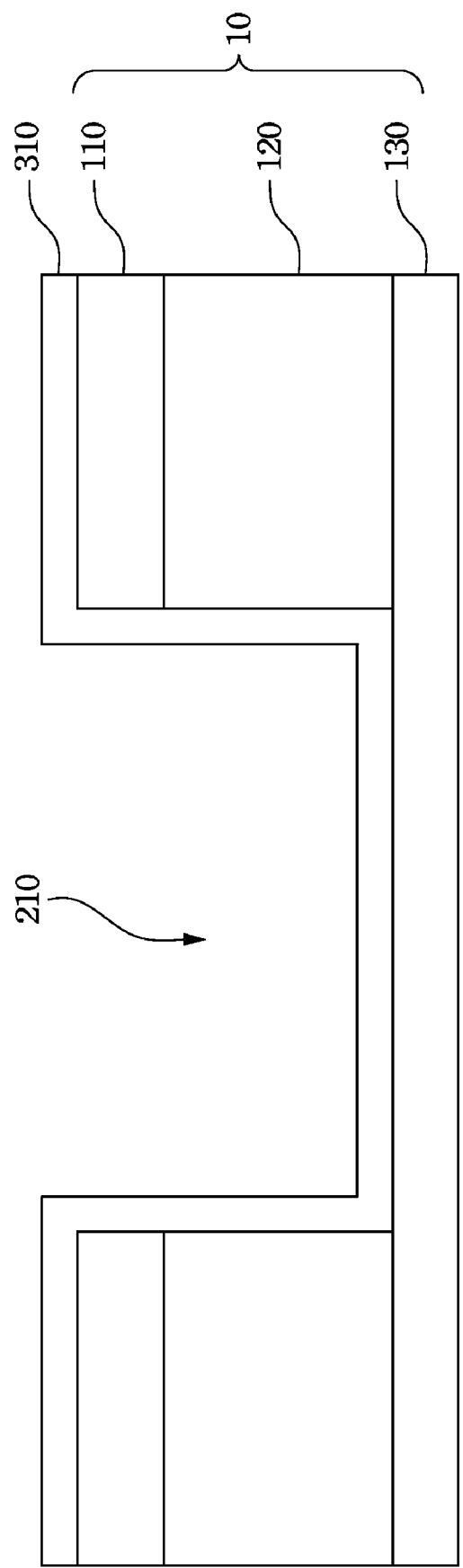

Please refer to FIG. 3. In FIG. 3, an electrode layer 310 is formed on the surface of the cavity 210 and the second metal layer 110. The electrode layer 310 is used for electrically connecting the LED die. It should be noted that the electrode layer 310 is formed on the surface of the cavity 210 and the second metal layer 110 by means of electroplating. In one embodiment, the electrode layer 310 that may comprises copper, nickel and gold may be formed in a manner similar to the above-mentioned first metal layer 130. For example, at first a copper layer (not shown) is formed on the surface of the cavity 210 and the second metal layer 110; then, a nickel layer (not shown) is formed on the copper layer; last, a gold layer (not shown) is formed on the nickel layer. In one embodiment, the electrode layer 310 may comprises silver. For example, the silver layer is formed on the surface of the cavity 210 and the second metal layer 110 by means of electroplating. One of ordinary skill in the art will appreciate that the above examples are provided for illustrative purposes only to further explain applications of the present invention and are not meant to limit the present invention in any manner. Any other manner for depositing the electrode layer 310 is also within the scope or spirit of the invention.

Figure 4B:
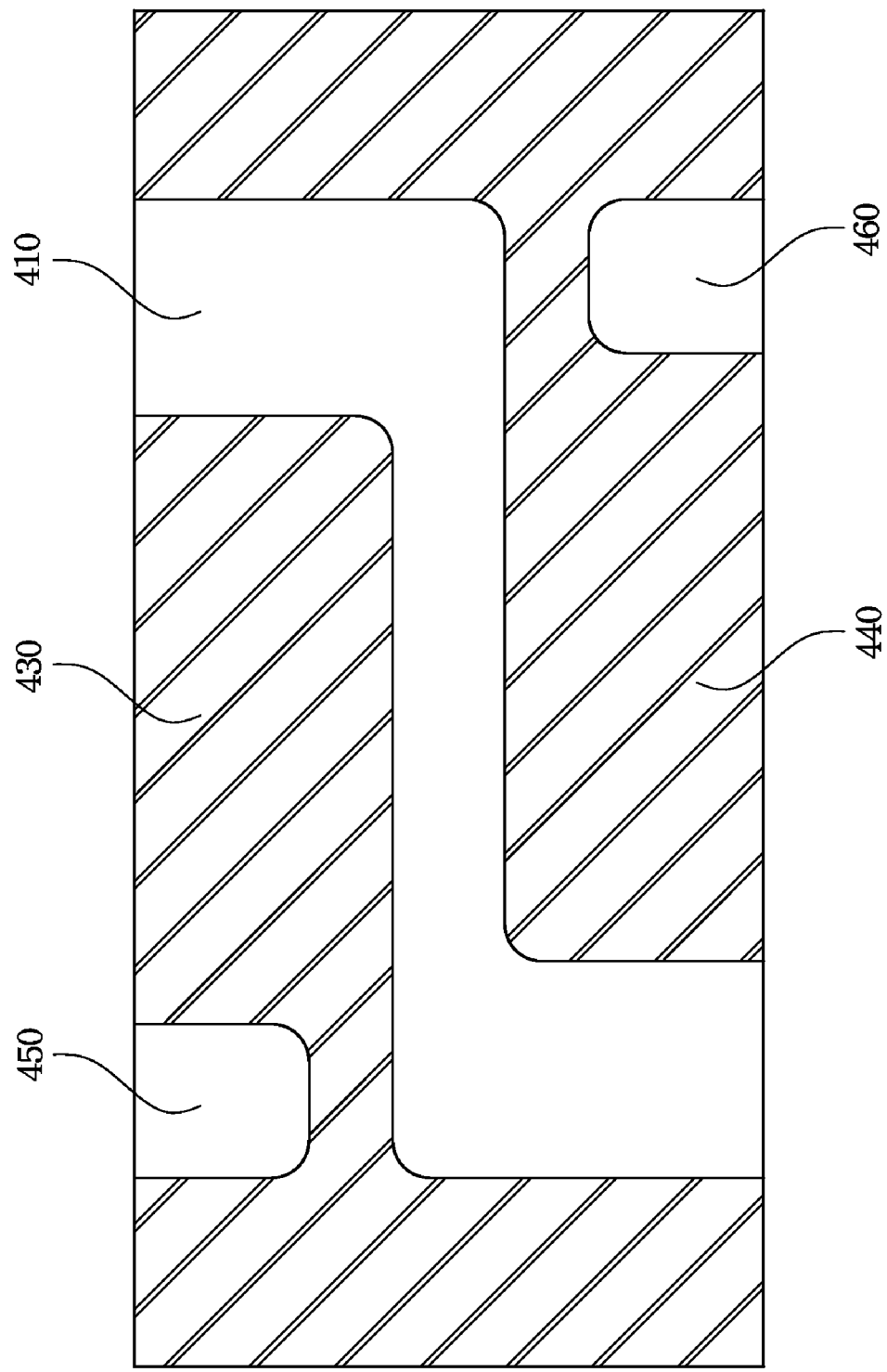
FIG. 4B is a top view of the bottom of the cavity 210 of FIG. 4A.
Figure 5:
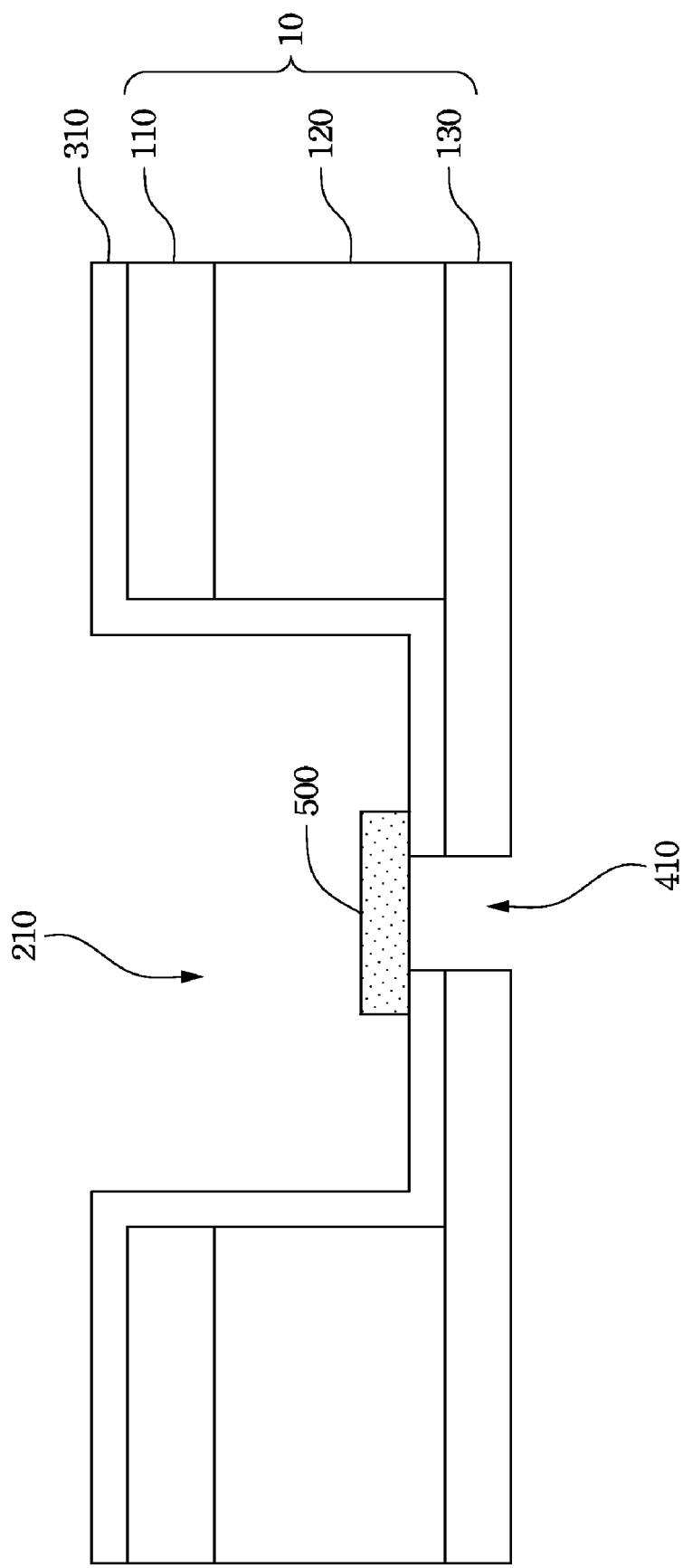
FIG. 5, FIG. 6, FIG. 7, FIG. 8 and FIG. 9 illustrate intermediate stages in forming a LED device in accordance with an embodiment of the present invention.

Please refer to FIG. 4A. In FIG. 4A, an opening 410 is formed through the bottom of the cavity 210. The opening 410 is formed through the bottom of the cavity 210 by means of etching or laser. The opening 410 penetrates the electrode layer 310 and the first metal layer 130. FIG. 4B is a top view of the bottom of the cavity 210. Please refer to FIG. 4A and FIG. 4B. The opening 410 separates the bottom of the cavity 210 into an anode 430 and a cathode 440. It should be noted that not only one opening 410 is formed in the bottom of the cavity 210. In practice process, a plurality of opening may be formed in the bottom of the cavity 210. In one embodiment, the first opening 450 is formed through the anode 430 and the second opening 460 is formed through the cathode 440. The first opening 450 and the second opening 460 penetrate the electrode layer 310 and the first metal layer 130.

FIG. 5, FIG. 6, FIG. 7, FIG. 8 and FIG. 9 illustrate intermediate stages in forming a LED device in accordance with an embodiment of the present invention. FIG. 10B is a top view of the LED device according to FIG. 5, FIG. 6, FIG. 7, FIG. 8 and FIG. 9. Please refer to FIG. 5 and FIG. 10B; a LED die 500 is disposed on the bottom of the cavity 210 across the opening 410. The opening 410 separates the bottom of the cavity 210 into the anode 430 and the cathode 440; therefore the positive electrode is electrically connected to the anode 430 and the negative electrode is electrically connected to the cathode 440 as the LED die 500 is disposed on the bottom of the cavity 210. The LED die 500 is fixed on the bottom of the cavity 210 in a flip-chip configuration.

Figure 6:
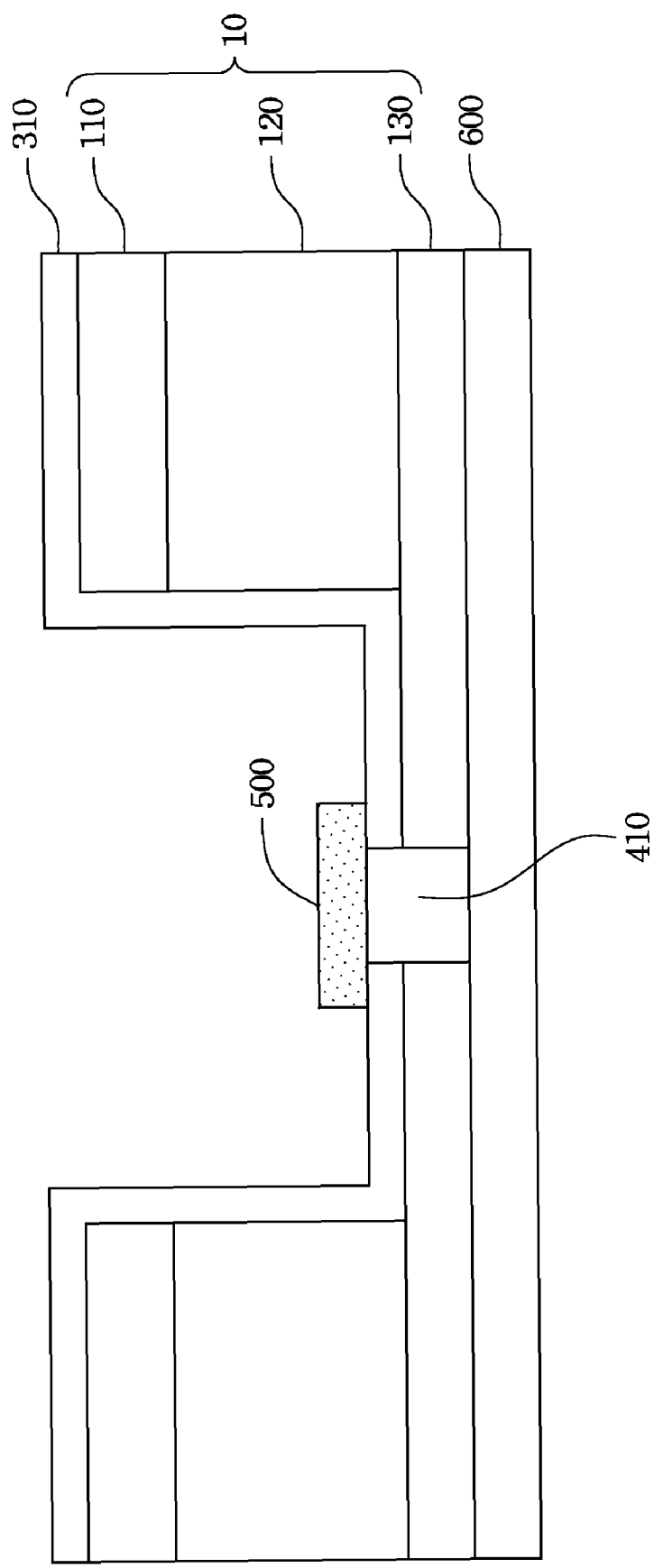

Please refer to FIG. 6. In FIG. 6, a film 600 adheres to the bottom surface of the substrate 10. The film 60 may comprise Polyimide (PI). It should be noted that the film 600 provides temporary mechanical and structural tool to prevent the packaging material is leaked from the opening 410 during subsequent processing steps. In addition, the substrate 10 may further comprise the above-mentioned first opening 450 and the above-mentioned second opening 460, therefore, the film 600 can prevent the packaging material is leaked from the first opening 450 and the second opening 460. In one embodiment, an adhesive (not shown) is used to glue the film 600 to the bottom surface of the substrate 10. The adhesive may be any suitable adhesive, such as ultraviolet glue, which loses its adhesive property when exposed to UV lights. This embodiment discussed is merely illustrative of specific ways to make and use the invention, and do not limit the scope of the invention. Other adhesive may also be used.

Figure 7:
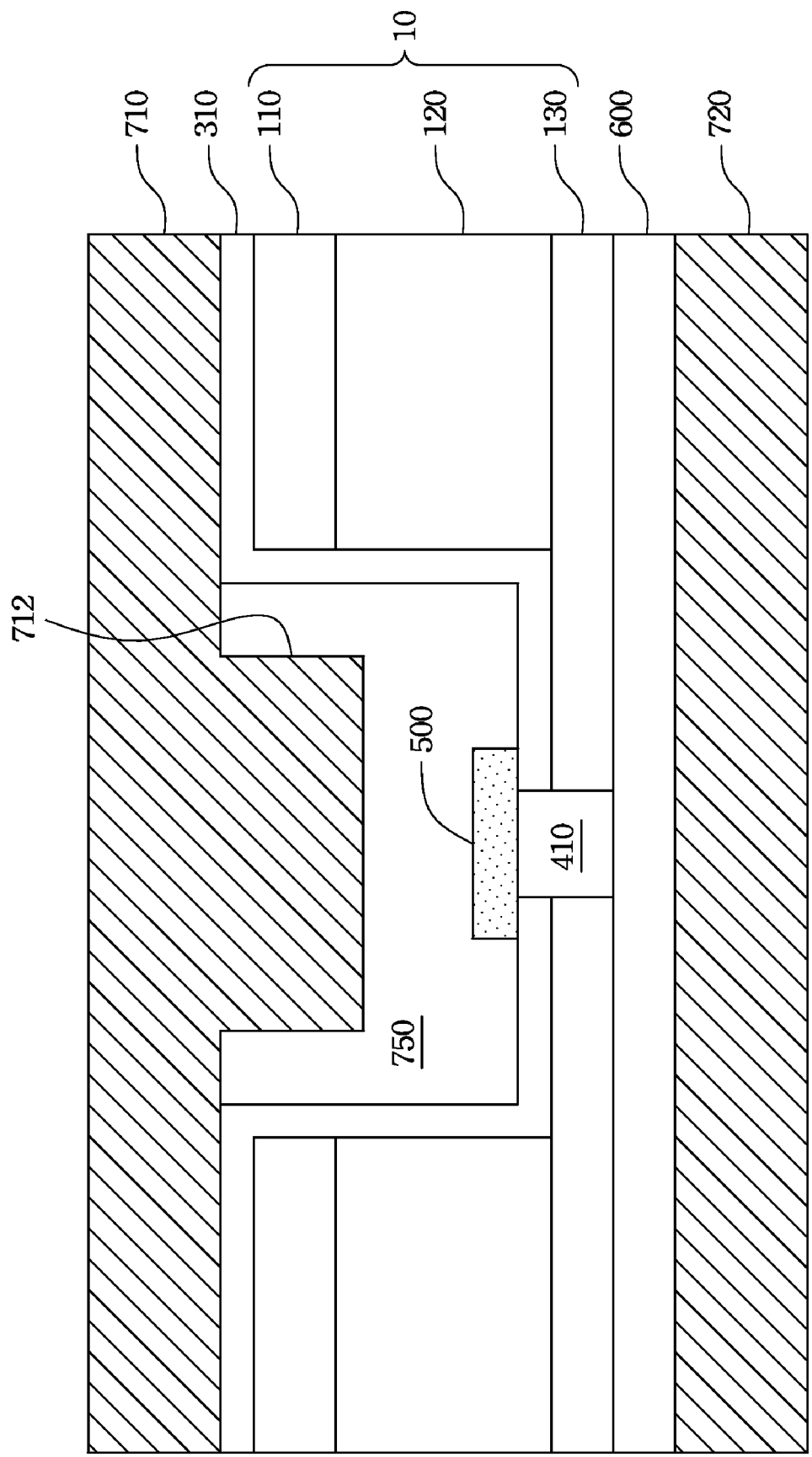

Please refer to FIG. 7. In FIG. 7, a forming mold is provided, wherein the forming mold comprises the upper mold 710 and the lower mold 720. In one embodiment, the substrate 10 is disposed in the forming mold for performing a molding process, wherein the upper mold 710 is disposed at a side of the substrate 10 and the lower mold 720 is disposed at another side of the substrate 10. In particular, the upper mold 710 is disposed on the electrode layer 310 and the lower mold 720 is disposed under the film 600. In addition, the upper mold 710 comprises a nose 712. The nose 712 is disposed in the cavity 210 and over the LED die 500. There was an interval between the nose 712 and the bottom of the cavity 210, and therefore a cavity 750 is formed between the nose 712 and the bottom of the cavity 210.

In conventional art of manufacturing LED device, the LED die is disposed on a lead frame and then in the forming mold for performing a molding process. However, the lead frame is so flimsy, and therefore is liable to become deformed by stress during the molding process. The conventional art of manufacturing LED device may result in lower yield. In one embodiment of the present invention, the substrate 10 is disposed in the forming mold for performing a molding process, where the second metal layer 110, the first metal layer 130, the gel layer 120 and electrode layer 310 are disposed between the upper mold 710 and the lower mold 720, so that the substrate can bear more stress during the molding process, therefore the substrate is difficult to become deformed by stress. In this embodiment of the present invention of manufacturing LED device may result in higher yield.

Figure 8:
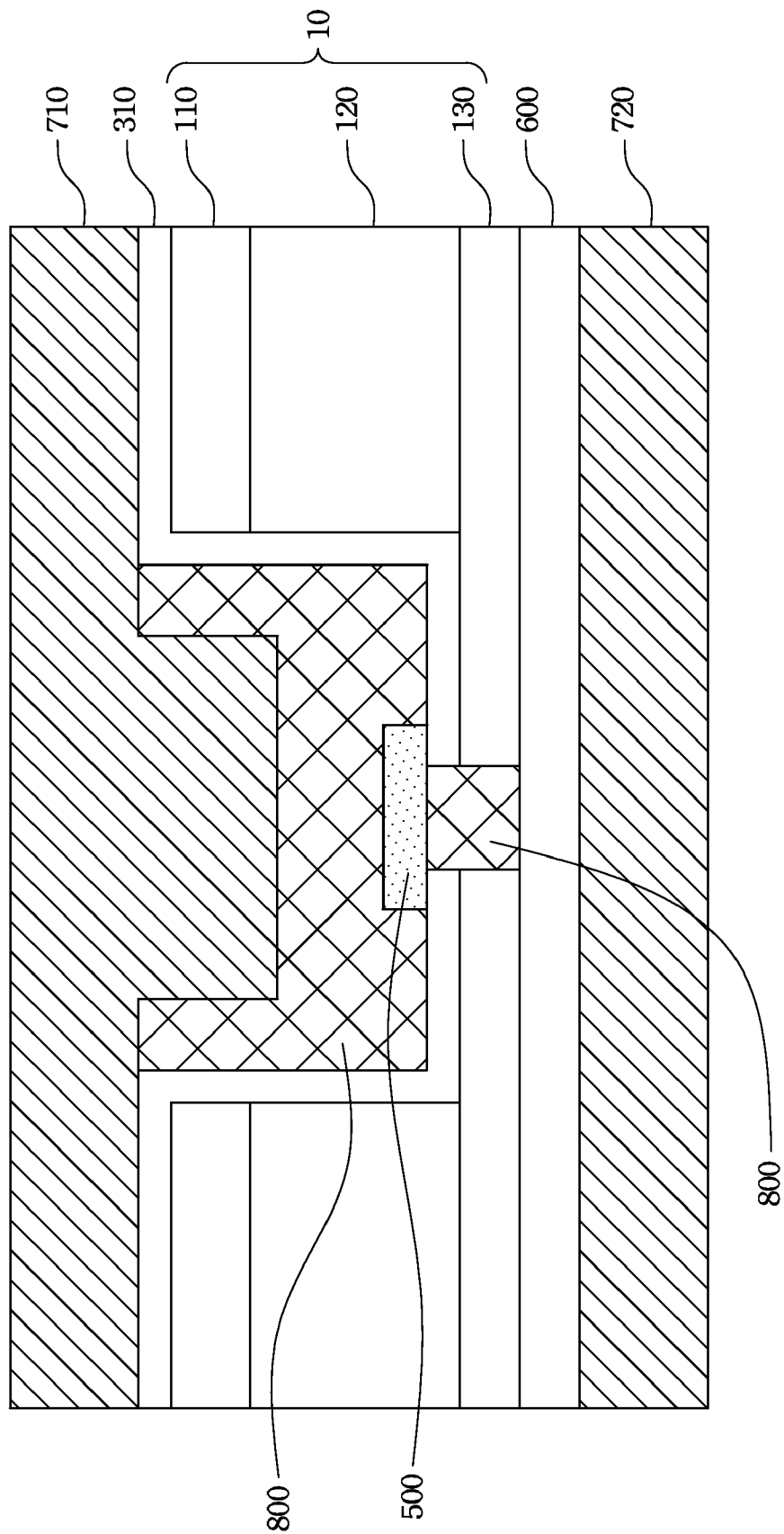

Please refer to FIG. 8. In FIG. 8, a sealing process is performed. In one embodiment, the cavity 750 is filled with packaging material 800. The packaging material 800 may comprise epoxy. The upper mold 710 and the lower mold 720 is removed after the packaging material 800 is hardened. It should be noted that the substrate 10 has the opening 410 penetrating the electrode layer 310 and the first metal layer 130. During the sealing process, the opening 410 is filled with the packaging material 800 and thereby the packaging material 800 can give lateral stress to the sides of the opening 410. After the packaging material 800 is hardened, the hardened packaging material 800 is steady and then the hardened packaging material 800 is difficult to peel off during separating the above-mentioned forming mold.

Figure 9:
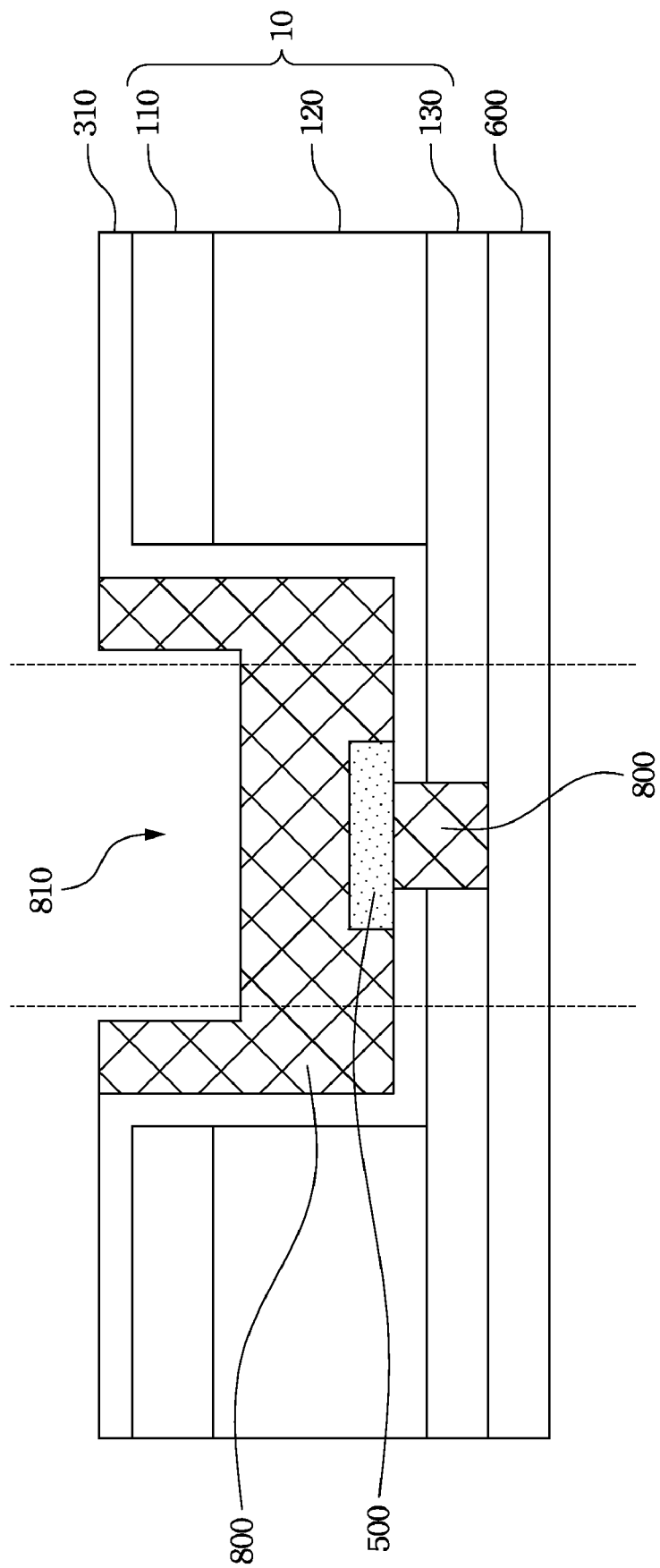
Figure 10A:
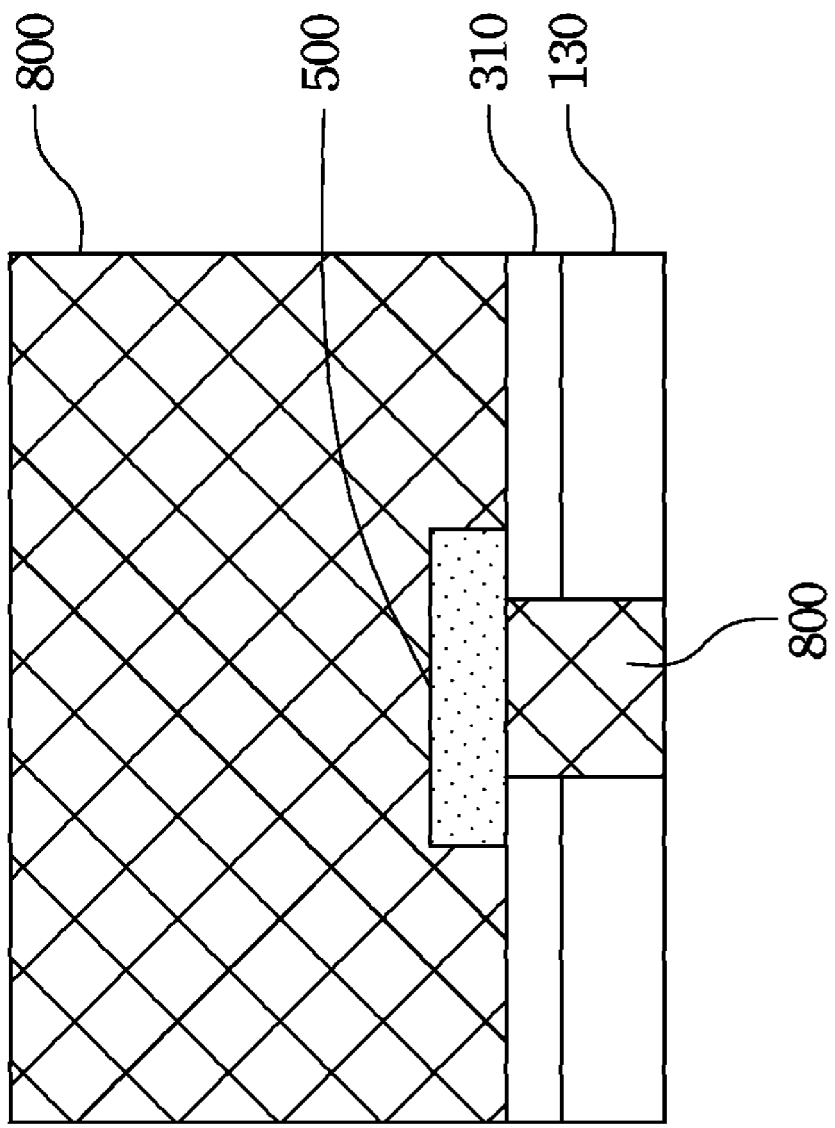
FIG. 10A is across-sectional view of the LED device according to FIG. 5, FIG. 6, FIG. 7, FIG. 8 and FIG. 9.
Figure 10B:
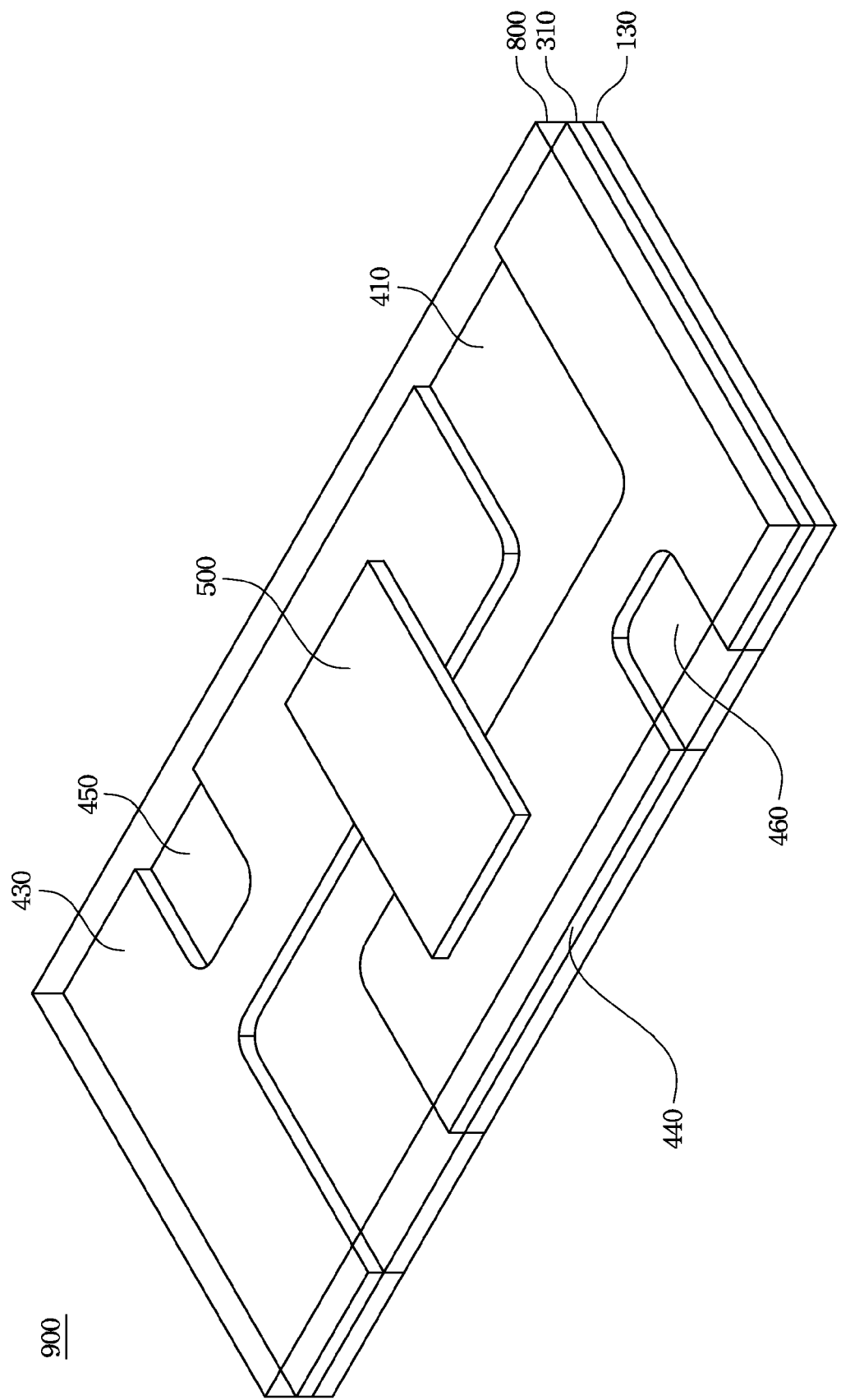
FIG. 10B is a top view of the LED device according to FIG. 5, FIG. 6, FIG. 7, FIG. 8 and FIG. 9.

Please refer to FIG. 9 and FIG. 10B, the upper mold 710 and the lower mold 720 is removed after performing sealing process. The upper mold 710 comprises a nose 712. After the packaging material 800 is hardened, it forms a recess 810 coupling the nose 712, whereby the thickness of the packaging material on the LED die 500 is reduced. After the upper mold 710 and the lower mold 720 are removed, the film 600 on the surface of the first metal layer 130 is removed. In one embodiment, the film 600 is removed before performing a cutting process, wherein the cutting process is performed to cut the substrate along a dotted line S in the recess 810. Alternatively, the film 600 is removed after performing a cutting process, wherein the cutting process is performed to cut the substrate along a dotted line S. the reader 190 may be e-book reader, e-paper device, cellular phone, or the like. It will be readily understood by those skilled in the art that the dotted line of FIG. 9 may be varied while remaining within the scope of the present invention. After the cutting process is performed, the LED device 900 is formed as shown in FIG. 10A.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for packaging a LED device, comprising:
    providing a substrate having a cavity;
    forming an electrode layer on the cavity and a surface of the substrate;
    forming an opening on a bottom surface of the cavity, the opening divided the electrode layer into an anode area and a cathode area;
    disposing a LED die on the bottom surface of the cavity and across the opening, and the LED die electrically connected to the anode and the cathode;
    filling a packaging material in the cavity and the opening;

curing the packaging material, wherein the cured packaging material comprises a recess correspondingly formed above the LED die; and performing a cutting process along a cutting line in the cavity to form the LED device.

2. The method as claimed in claim 1, wherein the substrate comprises a first metal layer, a second metal layer and a gel layer, wherein the gel layer is formed between the first metal layer and the second metal layer.

3. The method as claimed in claim 2, further comprising:
forming an adhesive film adhered to the bottom surface of the substrate for preventing the packaging material from leaking from the opening.

4. The method as claimed in claim 3, further comprising:
providing a forming mold, wherein the forming mold comprises an upper mold and a lower mold, the substrate is disposed in the forming mold for performing a molding process.

5. The method as claimed in claim 4, wherein the upper mold is disposed on the electrode layer and the lower mold is disposed under the film.

6. The method as claimed in claim 5, wherein the upper mold comprises a nose, wherein the nose is disposed in the cavity and over the LED die.

7. The method as claimed in claim 1, further comprising:
removing the forming mold from the recess of the packaging material after the step of curing the packaging material so as to reduce the thickness of the packaging material on the LED die.

8. The method as claimed in claim 3, further comprising:
removing the adhesive film after or before the step of cutting process.

* * * * *